(12) United States Patent
Nagami et al.

(10) Patent No.: US 8,434,198 B2
(45) Date of Patent: May 7, 2013

(54) FPC FIXING STRUCTURE FOR TWO-AXIS HINGE MECHANISM

(75) Inventors: Tetsuro Nagami, Tokyo (JP); Manami Hamada, Tokyo (JP); Tadashi Kamimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 205 days.

(21) Appl. No.: 13/061,726

(22) PCT Filed: Sep. 16, 2009

(86) PCT No.: PCT/JP2009/004633
§ 371 (c)(1),
(2), (4) Date: Mar. 2, 2011

(87) PCT Pub. No.: WO2010/073436
PCT Pub. Date: Jul. 1, 2010

(65) Prior Publication Data
US 2011/0146029 A1    Jun. 23, 2011

(30) Foreign Application Priority Data
Dec. 26, 2008 (JP) ................................. 2008-332829

(51) Int. Cl.
*E05D 3/10* (2006.01)
(52) U.S. Cl.
USPC .......... 16/367; 16/386; 248/923; 361/679.07; 361/755
(58) Field of Classification Search ............ 16/366, 16/367, 302, 386; 248/923; 296/1.07; 455/575.3, 455/566, 345; 379/433.13, 429; 361/679.06, 361/679.07, 755; 349/58
See application file for complete search history.

(56) References Cited

U.S. PATENT DOCUMENTS

| | | | |
|---|---|---|---|
| 6,650,547 B2 | 11/2003 | Hemmi et al. | |
| 7,191,491 B2 * | 3/2007 | Ibaraki et al. | 16/367 |
| 7,346,960 B2 * | 3/2008 | Higano et al. | 16/367 |
| 7,380,313 B2 * | 6/2008 | Akiyama et al. | 16/367 |
| 7,401,383 B2 * | 7/2008 | Pan | 16/367 |
| 7,499,737 B2 * | 3/2009 | Mizuta et al. | 455/575.3 |
| 7,669,289 B2 * | 3/2010 | Shih et al. | 16/367 |
| 7,685,681 B2 * | 3/2010 | Nakajima et al. | 16/367 |
| 7,688,397 B2 * | 3/2010 | Serizawa et al. | 349/58 |
| 7,792,555 B2 * | 9/2010 | Kawasaki et al. | 455/575.3 |
| 8,136,205 B2 * | 3/2012 | Endo et al. | 16/367 |
| 8,141,207 B2 * | 3/2012 | Endo et al. | 16/367 |
| 8,228,678 B2 * | 7/2012 | Hasegawa et al. | 361/755 |

(Continued)

FOREIGN PATENT DOCUMENTS

| | | |
|---|---|---|
| DE | 602 25 993 T2 | 6/2009 |
| EP | 1 313 358 A2 | 5/2003 |

(Continued)

*Primary Examiner* — William L. Miller
(74) *Attorney, Agent, or Firm* — Birch, Stewart, Kolasch & Birch, LLP

(57) ABSTRACT

First and second FPC fixing members 12, 13 are fixed within a boss 6 on a second axis Y, and one end of the second member 13 projects to the back of a hinge base 8. An FPC wiring fixing section 26 is fixed on the back of the base 8 on a first axis X. The fixing members pass an FPC 25 from the base 8 side to the side of a monitor 3 to hold the FPC linearly on the axis Y, and are turned integrally with a monitor mounting base 14. The fixing members curve outside the axis Y the FPC 25 that is led out in the direction orthogonal to the axis Y from the one end on the base 8 side of the second member 13 to have a deflection allowance, and fix the FPC to the base 8.

12 Claims, 12 Drawing Sheets

U.S. PATENT DOCUMENTS

| | | |
|---|---|---|
| 8,310,821 B2 * | 11/2012 | Ikunami .................. 361/679.01 |
| 2003/0044001 A1 | 3/2003 | Kim |
| 2003/0064758 A1 | 4/2003 | Mizuta et al. |

FOREIGN PATENT DOCUMENTS

| | | |
|---|---|---|
| JP | 2000-4084 A | 1/2000 |
| JP | 2003-204181 A | 7/2003 |
| JP | 2003-249987 A | 9/2003 |
| JP | 2005-90602 A | 4/2005 |
| JP | 2005-167597 A | 6/2005 |
| JP | 2005-234753 A | 9/2005 |
| JP | 2006-117977 A | 5/2006 |
| JP | 2006-186638 A | 7/2006 |
| JP | 2006-211690 A | 8/2006 |

* cited by examiner (a)

(b)

(a)

(b)

| Turn Angle of Second Axis Y | First Switch 22 | Second Switch 23 |
|---|---|---|
| 0° | OFF | OFF |
| θ° | ON | OFF |
| 180° | ON | ON |

0° < θ < 180°

(c)

(a)

(b)

FPC FIXING STRUCTURE FOR TWO-AXIS HINGE MECHANISM

TECHNICAL FIELD

The present invention is related to a fixing structure for wiring a flexible printed circuit board (hereinafter, referred to as an "FPC") in a two-axis hinge mechanism for turning, and folding and unfolding a monitor.

BACKGROUND ART

A conventional FPC wired in a two-axis hinge mechanism has a structure where the FPC is wound about a rotation shaft of a hinge circumferentially to be fixed. As disclosed in Patent Document 1, for example, in a two-axis hinge mechanism for turnably, and foldably and unfoldably connecting a display to a main body, a rotation shaft of the hinge is covered with a covering tube, and an FPC is wound around the covering tube. The FPC is constructed in a fixing structure which does not interfere with the turning operation of the hinge mechanism, when the rotation shaft is forwardly or backwardly rotated within the covering tube as the display is turned by virtue of the FPC wound around the covering tube being wound up or being loosened and swollen.

PRIOR ART DOCUMENTS

Patent Documents

Patent Document 1: JP-A-2005-234753

SUMMARY OF THE INVENTION

The conventional FPC fixing structure is arranged as described above; thus, if the hinge is to be rotated 180°, for example, at least the amount of $\pi D^2/4$ relative to the diameter of the shaft D is required as the amount of winding of FPC by the rotation. Further, in order to build a structure that does not so much swell the FPC around the rotation shaft during the rotation, it is necessary to wind a significant number of layers of FPC around the shaft. For this reason, there are the following problems: the workability is deteriorated during the assembly of the FPC, and further the FPC is also increased in length.

Furthermore, the FPC is provided with a bend section for connecting a rotation section wound around the covering tube with a straight line section to be led out to the side of the main body; however, there is the problem such that when the FPC is twisted by the rotation of the rotation shaft, stresses are concentrated on the bend section of the FPC to be easily cut. Further, since the straight line section is also affected by the twist, the FPC is easily displaced from a connector when an FPC connecting member such as a connector is used. This occasionally causes difficulties in the electrical connection.

Moreover, rolled copper is typically employed for an FPC having to be repeatedly flexed with opening and closing operations of the hinge as its conductors, and is wired in the hinge with the rolling direction of the conductor aligned with the direction where the FPC is flexed. However, in the two-axis hinge mechanism disclosed in Patent Document 1, one direction where a portion of the FPC is flexed is different from the other direction where the other portion thereof is flexed by 90° between the turning portion and the folding and unfolding portion of the hinge; thus, one of the two portions has long flexure life, while the other has short one. Because of this, there is the problem such that the FPC has the flexure life unbalanced in the turning section and the folding and unfolding section.

The present invention has been made to solve the above-mentioned problems, and an object of the present invention is to provide an FPC fixing structure for a two-axis hinge mechanism capable of preventing an FPC from being damaged by the turning operation and the folding and unfolding operation of a monitor and also reducing stresses induced in flexing.

The FPC fixing structure of a two-axis hinge mechanism according to the present invention is arranged to fix an FPC used for an electrical connection between a main body apparatus and a monitor to a two-axis hinge mechanism composed of a monitor folding and unfolding mechanism for allowing the monitor to be folded and unfolded with respect to the main body apparatus about a first axis and a monitor turning mechanism for allowing the monitor having been rotated in the unfolded direction with respect to the first axis to be turned about a second axis orthogonal to the first axis, wherein the monitor turning mechanism includes: a tubular boss of which one end is fixed to the side of the monitor and the other end is turnably supported by a base of the monitor folding and unfolding mechanism about the second axis; an FPC fixing member that is fastened within the boss, protrudes from the base of the monitor folding and unfolding mechanism, also has an insertion opening through the end face thereof on the base side, and passes the FPC through the insertion opening to the side of the monitor to hold the FPC linearly on the second axis; and an FPC wiring fixing section that curves outside the second axis the FPC that is led out from the one end side of the FPC fixing member where the insertion opening is provided in the direction orthogonal to the second axis, to cause the FPC to have a deflection allowance, and that fixes the FPC to the base.

According to the present invention, the FPC is held linearly on the monitor turning axis and also the deflection allowance is provided outside the monitor turning axis. This can prevent the FPC from being damaged by the turning operation, and the folding and unfolding operation of the monitor, and can reduce the amount of flexure of the FPC. Further, providing the deflection allowance outside the monitor turning axis can ensure a large circular arc of the FPC to enable the reduction of stresses caused by the flexure of the FPC.

BRIEF DESCRIPTION OF THE DRAWINGS

FIG. 3(a) is an external perspective view; and FIG. 3(b) is an external side view.

FIG. 4(a) is a front view of the first FPC fixing member seen from the direction A shown in FIG. 3(b); and FIG. 4(b) is a front view of the second FPC fixing member seen from the direction B.

FIG. 5(a) shows a state where the monitor faces the front; FIG. 5(b) shows a state where the monitor is being turned; and FIG. 5(c) shows a state where the monitor is reversed.

FIG. 8(a) shows a state where the FPC is being wired, and FIG. 8(b) shows the state where the FPC is fixed after wiring.

BEST MODE FOR CARRYING OUT THE INVENTION

Embodiments of the present invention will now be described with reference to the accompanying drawings in order to explain the present invention in more detail.

First Embodiment

Figure 1A:
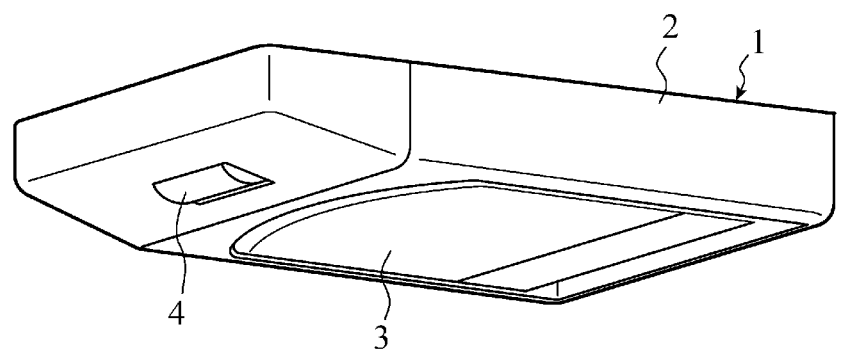
FIG. 1A is a perspective view showing an operation of a monitor of a two-axis hinge mechanism in accordance with a first embodiment of the present invention is applied with the monitor folded.
Figure 1B:
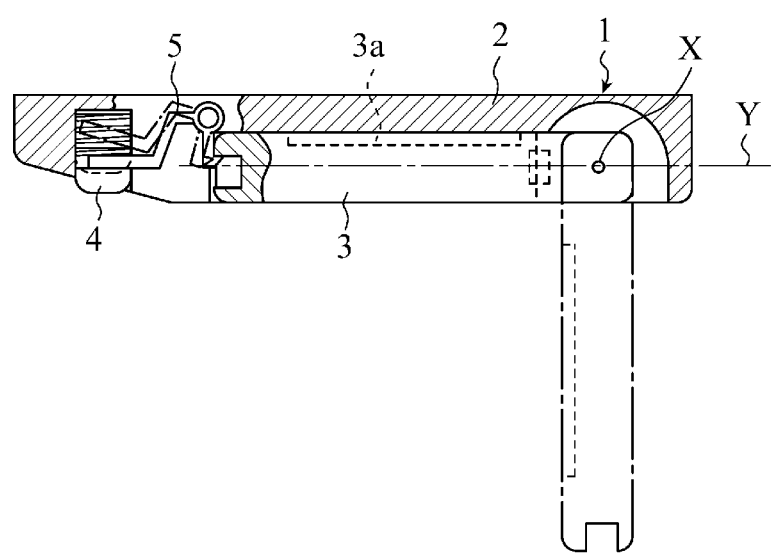
FIG. 1B is a schematic sectional view of the state shown in FIG. 1A.
Figure 1C:
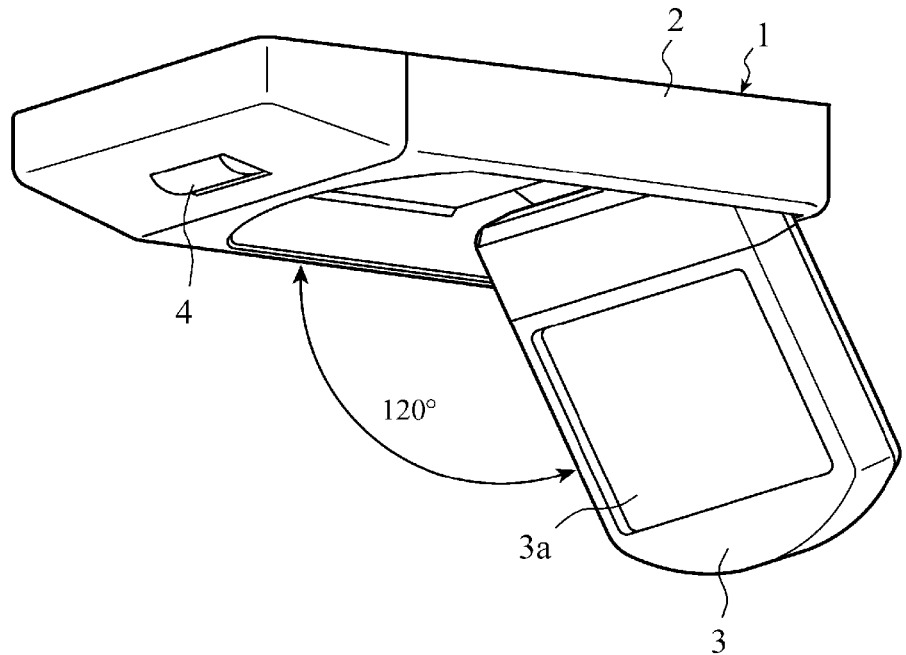
FIG. 1C is a perspective view showing an operation of the monitor of the two-axis hinge mechanism in accordance with the first embodiment of the present invention with the monitor opened 120°.
Figure 1D:
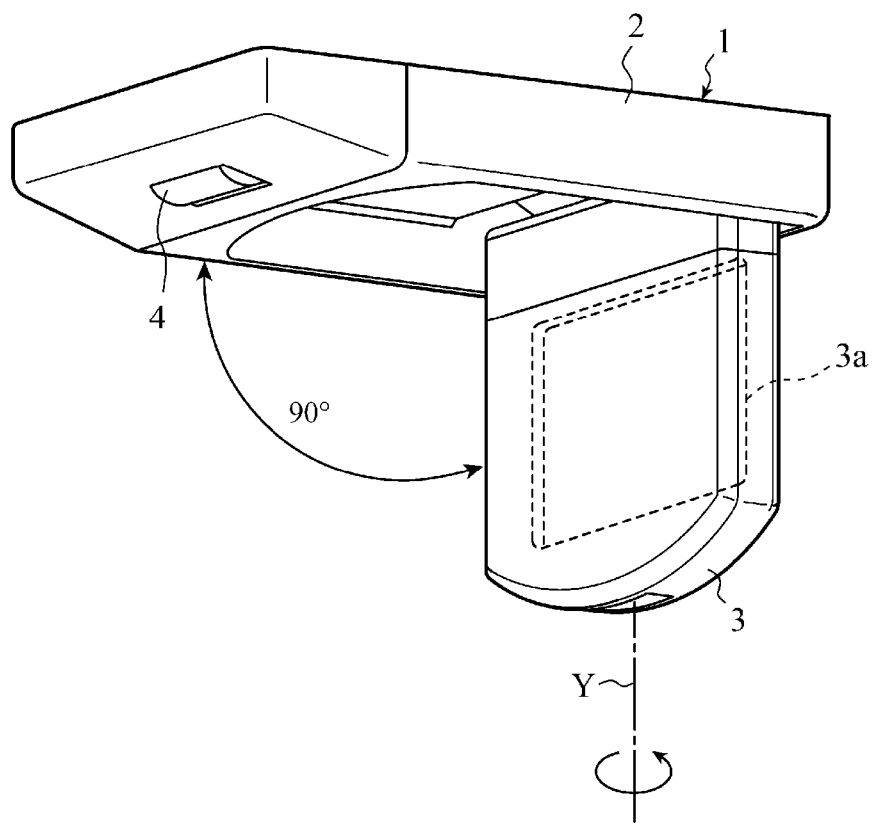
FIG. 1D is a perspective view showing an operation of the monitor of the two-axis hinge mechanism in accordance with the first embodiment of the present invention with the monitor opened 90°.

In a first embodiment, a two-axis hinge mechanism according to the present invention is applied to a monitor apparatus mounted on the ceiling of the interior of a vehicle. FIG. 1A to FIG. 1D are views showing a series of turning, and folding and unfolding operations of a monitoring apparatus 1 including a two-axis hinge mechanism 10 in accordance with the first embodiment. FIG. 1A is a perspective view showing a state where a monitor 3 is housed in a monitor housing case 2, and FIG. 1B is a sectional view thereof. FIG. 1C is a perspective view of a state where the monitor 3 is unfolded 120°, and FIG. 1D is a perspective view of a state where the monitor 3 is unfolded 90°.

As shown in FIG. 1A, the monitor apparatus 1 is composed of: the monitor housing case 2 on the side of a main boy apparatus mounted on the ceiling of a vehicle; and the monitor 3 that can be unfolded and folded when turned (opened and closed) with respect to the monitor housing case 2. The monitor 3 has a screen 3a provided on one face thereof. Further, the monitor 3 is locked by a lock 5 associated with a button 4 to be held in the monitor housing case 2. When the button 4 provided on the housing case 2 is pushed, the lock 5 holding the monitor 3 is disengaged therefrom as shown by a dash and dotted line in FIG. 1B, and the monitor 3 is rotated up to a predetermined angle by its own weight about a first axis X. Thereafter, a user opens or closes the monitor 3 to the position shown in FIG. 1C by a manual operation to enjoy the images. Further, when a user wants to view the screen 3a in a position except the front of the monitor housing case 2, the user turns the monitor 3 to a desired position about a second axis Y orthogonal to the first axis X as shown in FIG. 1D to enjoy the images.

Figure 2A:
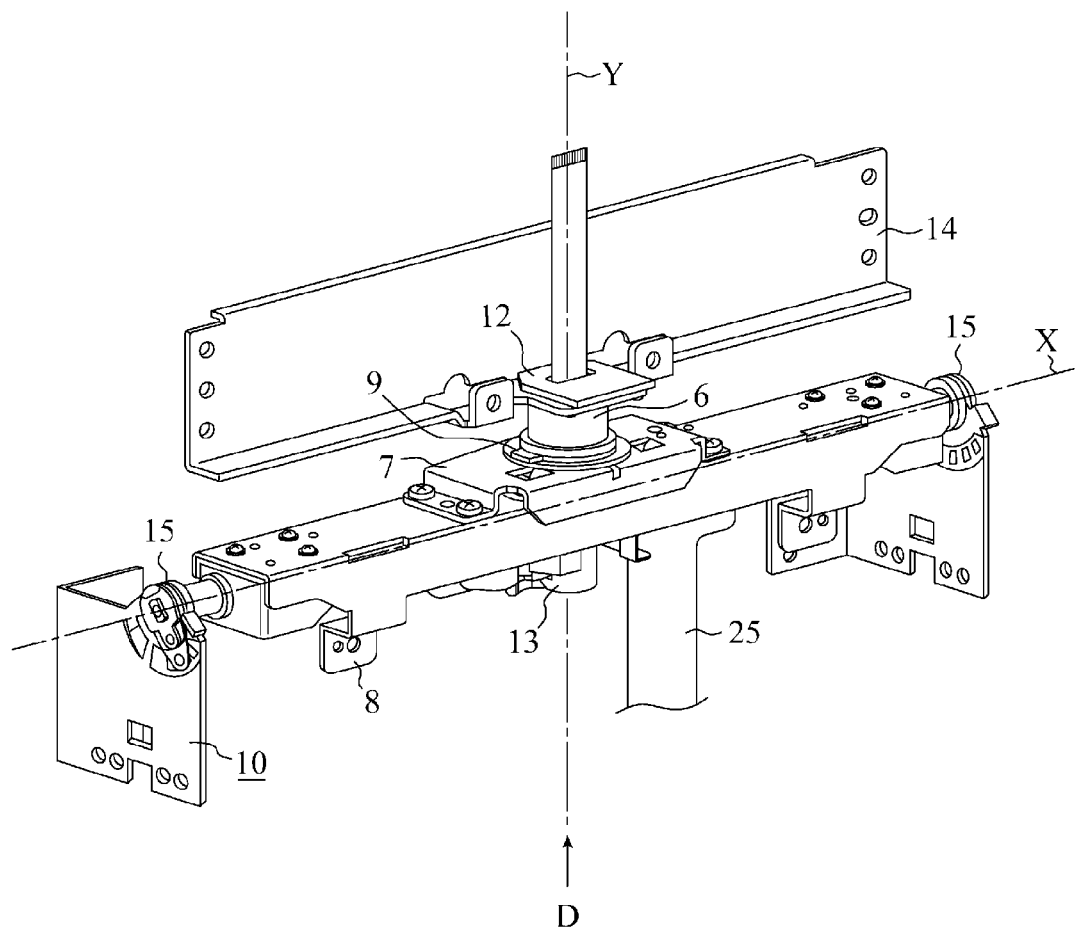
FIG. 2A is a perspective view showing a two-axis hinge mechanism in accordance with the first embodiment of the present invention and an FPC fixing structure combined with the two-axis hinge mechanism.

Next, a description is given of the composition of the two-axis hinge mechanism 10 in accordance with the first embodiment. FIG. 2A is a perspective view showing the two-axis hinge mechanism 10 employed in the monitor apparatus 1 shown in FIG. 1A to FIG. 1D and an FPC fixing structure combined with the two-axis hinge mechanism 10, and FIG. 2B is an exploded perspective view thereof.

Figure 2B:
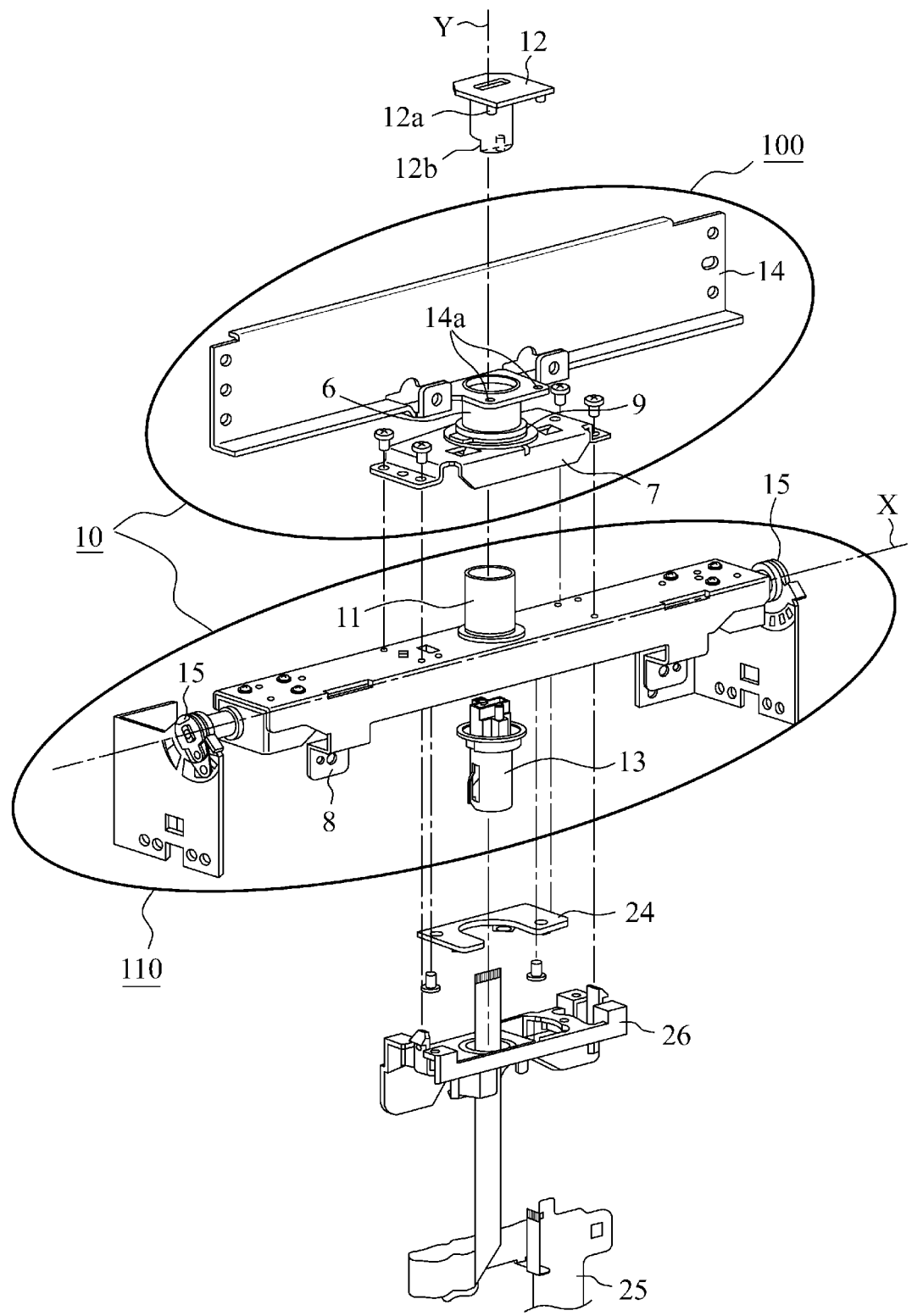
FIG. 2B is an exploded perspective view of the two-axis hinge mechanism and the FPC fixing structure shown in FIG. 2A.

As shown in FIG. 2A and FIG. 2B, the two-axis hinge mechanism 10 is composed of: a monitor turning mechanism 100 for turning the monitor 3 (not shown) attached to a monitor mounting base 14 with the second axis Y as a rotation central axis; and a monitor folding and unfolding mechanism 110 for folding and unfolding the monitor 3 housed in the monitor housing case 2 with the first axis X as a rotation central axis.

In the monitor folding and unfolding mechanism 110, a hinge base 8 has a tilt hinge 15 attached to each end thereof to rotate the hinge base 8 integrally with the monitor turning mechanism 100 about the first axis X. In the monitor turning mechanism 100, the hinge base 8 has a sub-base 7 fastened thereto by screws, and also a tubular boss 6 has a bush 11 inserted therein. The boss 6 is fixed to the monitor mounting base 14 to be integral therewith. The boss 6 and the monitor mounting base 14 are attached rotatably to the sub-base 7 by a rotation hinge member such as a leaf spring 9 or the like, and are rotated with respect to the sub-base 7 and the hinge base 8 about the second axis Y. The two-axis hinge mechanism 10 composed of the monitor turning mechanism 100 and the monitor folding and unfolding mechanism 110 allows the monitor 3 to be folded and unfolded, and turned.

Figure 3:
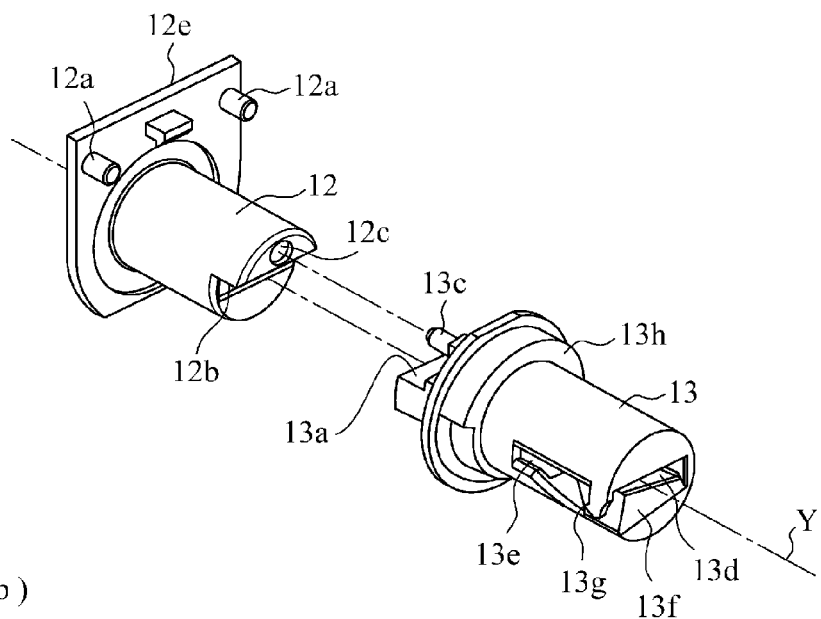
FIG. 3(a) and FIG. 3(b) show a first and a second FPC fixing members constituting an FPC fixing member in accordance with the first embodiment of the present invention.
Figure 3:
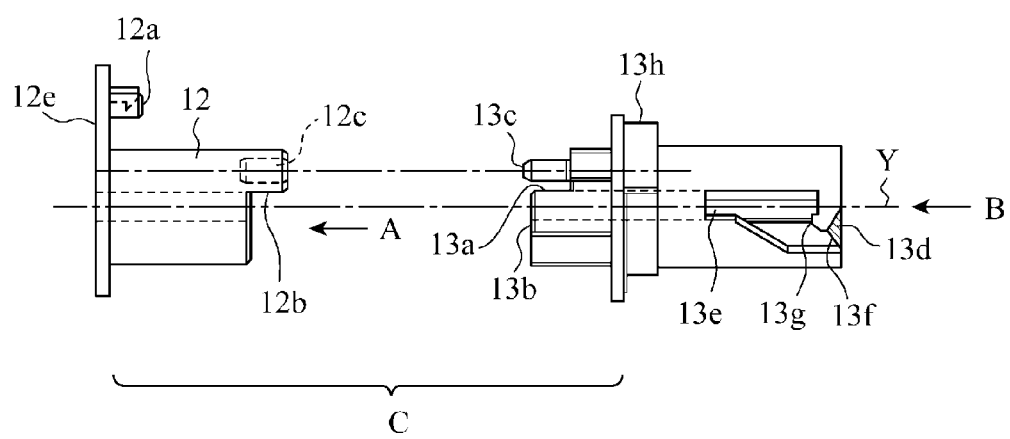
Figure 4:
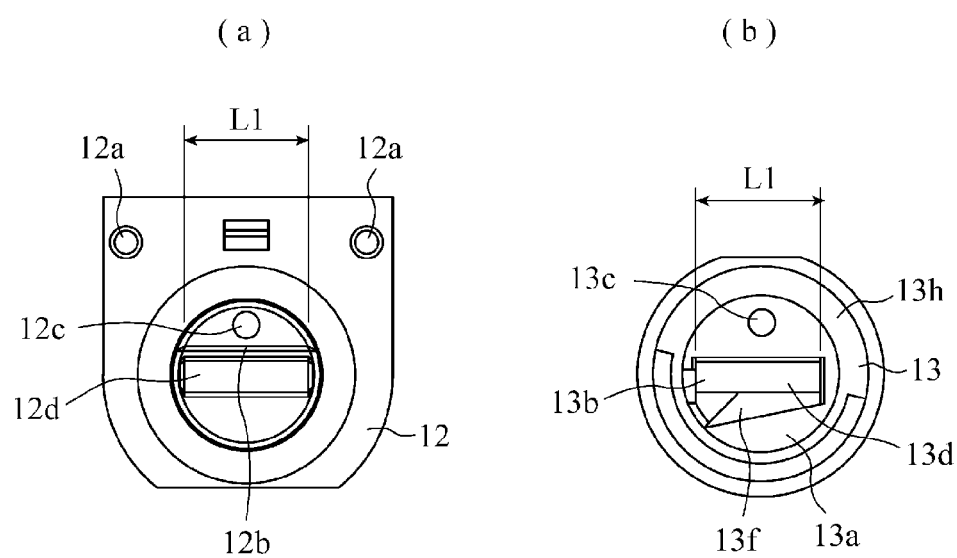
FIG. 4(a) and FIG. 4(b) show an FPC fixing structure in accordance with the first embodiment of the present invention.
Figure 5:
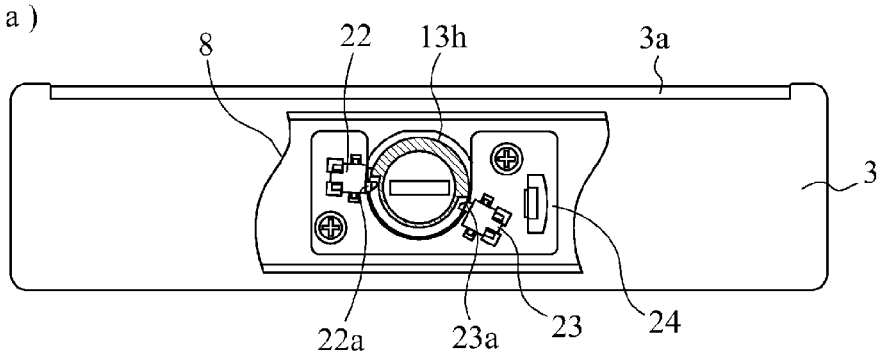
FIG. 5(a) to FIG. 5(c) are explanatory views showing the composition, seen from the direction D shown in FIG. 2A, of the turn position detecting means of the FPC fixing structure in accordance with the first embodiment of the present invention.
Figure 5:
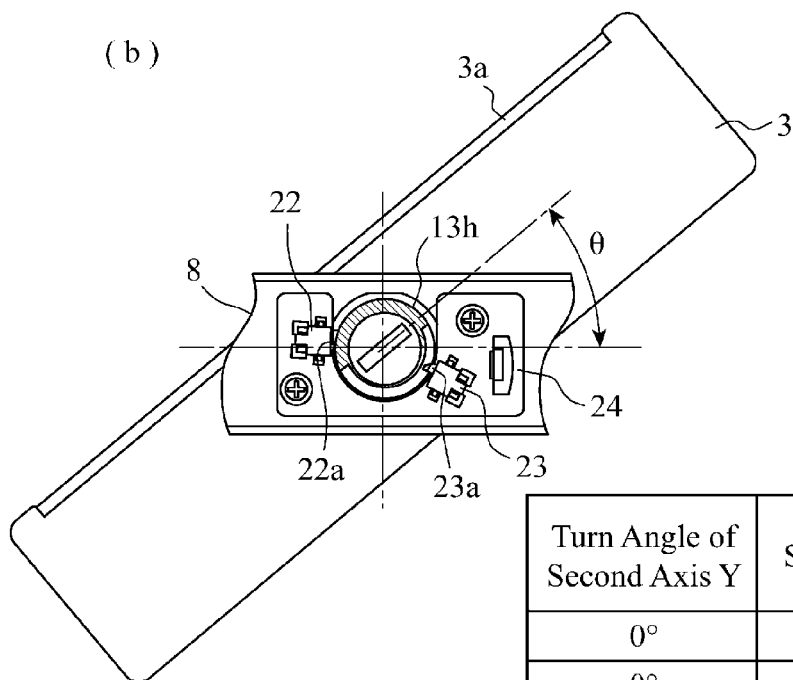
Figure 5:
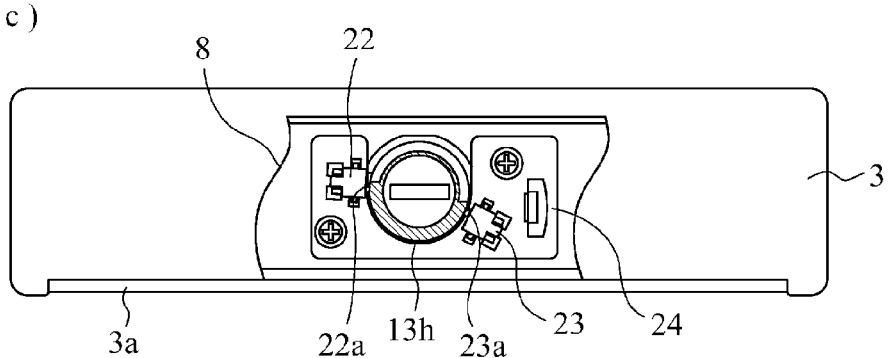
Figure 6:
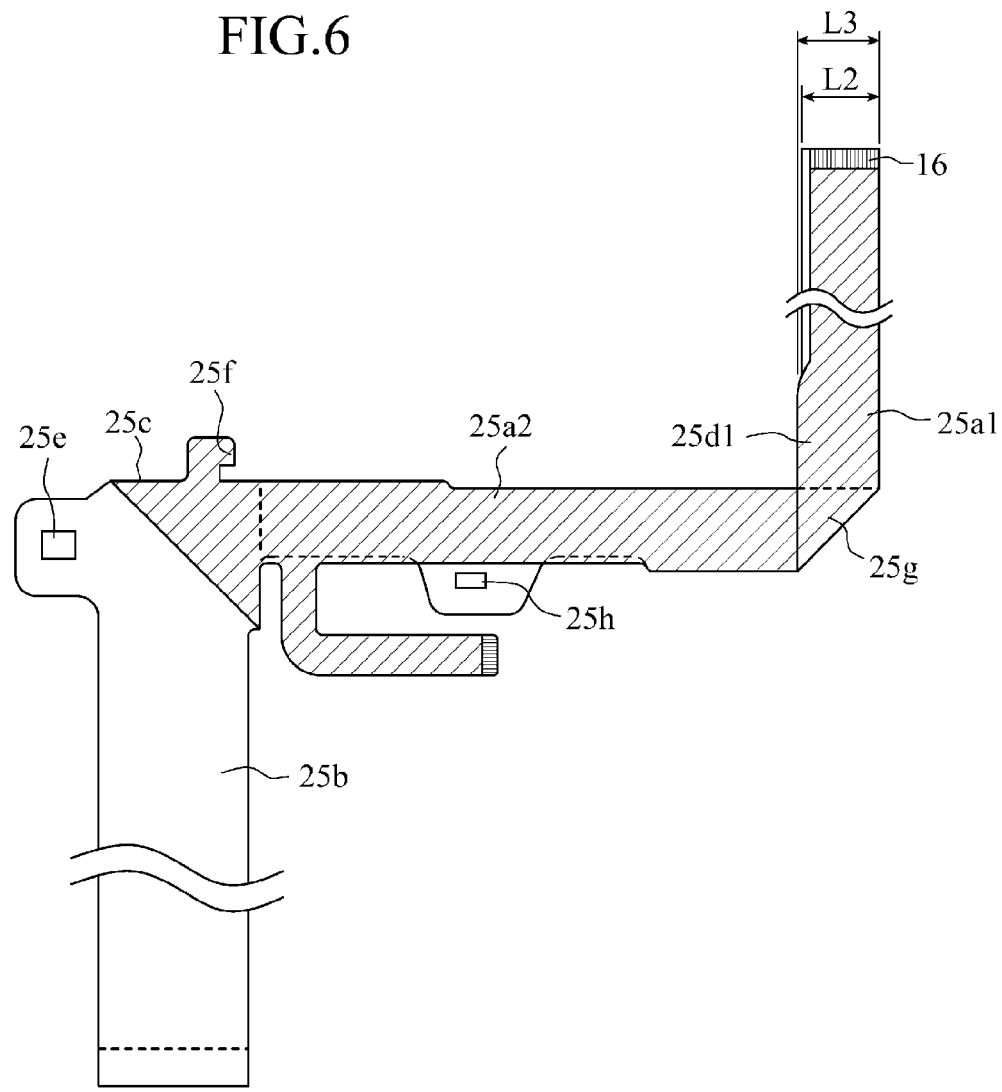
FIG. 6 is a front view showing the shape of a formed FPC in accordance with the first embodiment of the present invention.
Figure 7A:
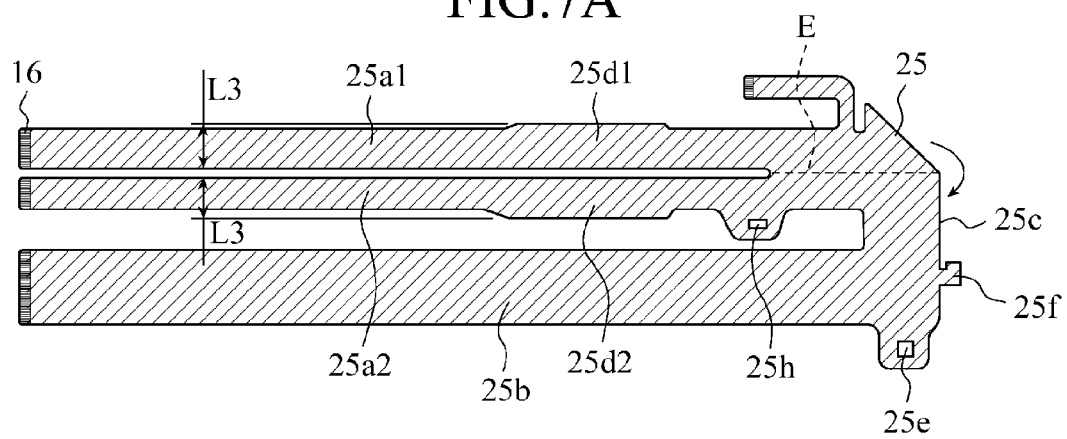
FIG. 7A is a front view showing the shape of a not-yet-formed FPC in accordance with the first embodiment of the present invention.

Next, an explanation will be given of an FPC 25 and an FPC fixing structure in accordance with the first embodiment. FIG. 3(a) and FIG. 3(b) show a first FPC fixing member 12 and a second FPC fixing member 13 constituting an FPC fixing member; FIG. 3(a) is an external perspective view, and FIG. 3(b) is an external side view. FIG. 4(a) is a front view of the first FPC fixing member 12 seen from the direction A shown in FIG. 3(b), and FIG. 4(b) is a front view of the second FPC fixing member 13 seen from the direction B. FIG. 5(a) to FIG. 5(c) are explanatory views showing the structure of the turn position detecting means of the FPC fixing structure, seen from the direction D shown in FIG. 2A; FIG. 5(a) shows a state where the monitor faces the front, FIG. 5(b) shows a state where the monitor is being turned, and FIG. 5(c) shows a state where the monitor is reversed. FIG. 6 is a front view showing a shape of the FPC 25 after formation, FIG. 7A is a front view showing a shape thereof before formation, and FIG. 7B (a) to FIG. 7B (c) are explanatory views showing folding procedures for forming the FPC 25. FIG. 7C is an explanatory view showing an example of disposing boards in producing the FPCs 25. FIG. 8(a) and FIG. 8(b) are perspective views showing the FPC fixing structure seen from the direction D shown in FIG. 2A; FIG. 8(a) shows a state where the FPC 25 is being wired, and FIG. 8(b) shows a state where the FPC is fixed after wiring.

The first FPC fixing member 12 and the second FPC fixing member 13 molded from a resin are inserted into the tubular boss 6 and the bush 11 serving as the second axis Y of the monitor 3. While a flange section 12e formed on one end side of the first FPC fixing member 12 remains, the portion except the flange section (the portion C shown in FIG. 3(b)) is housed within the boss 6 and the bush 11. In the other second FPC fixing member 13, the one end portion thereof coupled with the first FPC fixing member 12 is housed within the boss 6 and the bush 11, and the other main portion thereof (except the portion C shown in FIG. 3(b)) is projected from the hinge base 8.

In order to be synchronized with the turn of the monitor 3 centered on the second axis Y, protrusions 12a to be positioned in positioning holes 14a provided through the monitor mounting base 14 are prepared on the first FPC fixing member 12. Further, a cutaway 12b and a hole 12c are provided in the first FPC fixing member 12, in order to transmit the turn synchronized with the monitor mounting base 14 to the second FPC fixing member 13. An abutment face 13a for engaging with the cutaway 12b of the first FPC fixing member 12 and a protrusion 13c for fitting in the hole 12c of the first FPC fixing member 12 are provided in the other second FPC fixing member 13. In such a way, the second FPC fixing member 13 is rotated in synchronization with the first FPC fixing member 12.

A switch abutting section 13h is provided around the second FPC fixing member 13. The switch abutting section 13h constitutes a portion of a turn position detecting means for detecting the turn angle of the monitor 3, and is formed by shaping a part of the outer peripheral face on one end side of the second FPC fixing member 13 to be in the form of a projection. As shown in FIG. 5, the turn position detecting means is composed of a switch board 24 attached on the hinge base 8, a first switch 22 and a second switch 23 located on the switch board 24, and the switch abutting section 13h for abutting against those first switch 22 and second switch 23. However, in FIG. 5(a) to FIG. 5(c), for the sake of simplification of explanations, the components unnecessary for the explanations such as the FPC 25 and the FPC wiring fixing portion 26 are omitted. The first switch 22 includes a first knob 22a, the second switch 23 includes a second knob 23a; when the switch abutting section 13h abuts against the first knob 22a and the second knob 23a, the switch of the abutted knob goes to an "ON" state. This arrangement allows the turn position detecting means to detect the turn angle of the monitor 3.

In the state where the screen 3a of the monitor 3 faces the front, as shown in FIG. 5(a), since the first knob 22a and the second knob 23a are not abutted against the switch abutting section 13h, the first switch 22 and the second switch 23 are in an "OFF" state. As the monitor 3 begins to be turned about the second axis Y, the first knob 22a abuts against the switch abutting section 13h as shown in FIG. 5(b), and the first switch 22 goes to an "ON" state. In the state where the monitor 3 is fully turned (180°), the first knob 22a and the second knob 23a abut against the switch abutting section 13h as shown in FIG. 5(c), and the first switch 22 and the second switch 23 are in an "ON" state. Therefore, three states, namely the state where the monitor 3 faces the front (the turn angle θ is 0°), the state where the monitor is being turned (0°<θ<180°) and the state where the monitor is reversed (the turn angle θ is 180°) can be detected. By using the turn position detecting means, operations such as turning off images during the turn of the monitor 3, for instance, can be performed.

An elongated hole 12d and an elongated hole 13b for allowing the FPC 25 to be wired are provided through the first FPC fixing member 12 and the second FPC fixing member 13, respectively. The opening on one end side of the elongated hole 13b works as an insertion opening 13d for inserting the FPC 25 from the side of an FPC terminal section 16. The coupling of the first FPC fixing member 12 and the second FPC fixing member 13 provides a communication between the elongated hole 12d and the elongated hole 13b, thus enabling the first straight line sections 25a1, 25a2 of the FPC 25 to be passed therethrough linearly on the second axis Y. The elongated holes 12d, 13b, and the insertion opening 13d have a width L1 which is somewhat larger than that of the width L2 of the FPC terminal section 16 such that the FPC terminal section 16 is not stressed at the insertion of the FPC 25.

An opening 13e projecting from the hinge base 8 is provided through the outer peripheral face of the second FPC fixing member 13 and communicates with the insertion opening 13d. Further, one end edge of the insertion opening 13d forms a tapered guide 13f obliquely expanding toward the opening 13e. Moreover, a tapered protrusion 13g having a tapered tip is provided between the insertion opening 13d and the opening 13e.

Though the FPC 25 to be fixed to the FPC fixing structure of the two-axis hinge mechanism 10 is formed as shown in FIG. 6, the FPC is U-shaped as shown in FIG. 7A before formation. In FIG. 7A, rolled copper is employed for the pattern line (not shown), and the longitudinal direction of the FPC 25 is aligned with the rolling direction of the rolled copper. Furthermore, in FIG. 6 to FIG. 7B, the surface of the FPC where the pattern line is formed is shown by hatching for distinguishing between the surface and the back of the FPC 25. The first straight line sections 25a1, 25a2 forming a straight line section on one side of the U-shaped are used for the turning flexure portion of the second axis Y, while the second straight line section 25b forming a straight line section on the other side thereof is used for the folding and unfolding flexure portion of the first axis X. However, since the second axis Y and the first axis X of the two-axis hinge mechanism 10 are orthogonal to each other in the rotation direction, it is necessary to change the direction of the FPC 25 by 90°. Thus, the U-shaped FPC 25 is folded and formed to be an L-shaped one.

Figure 7B:
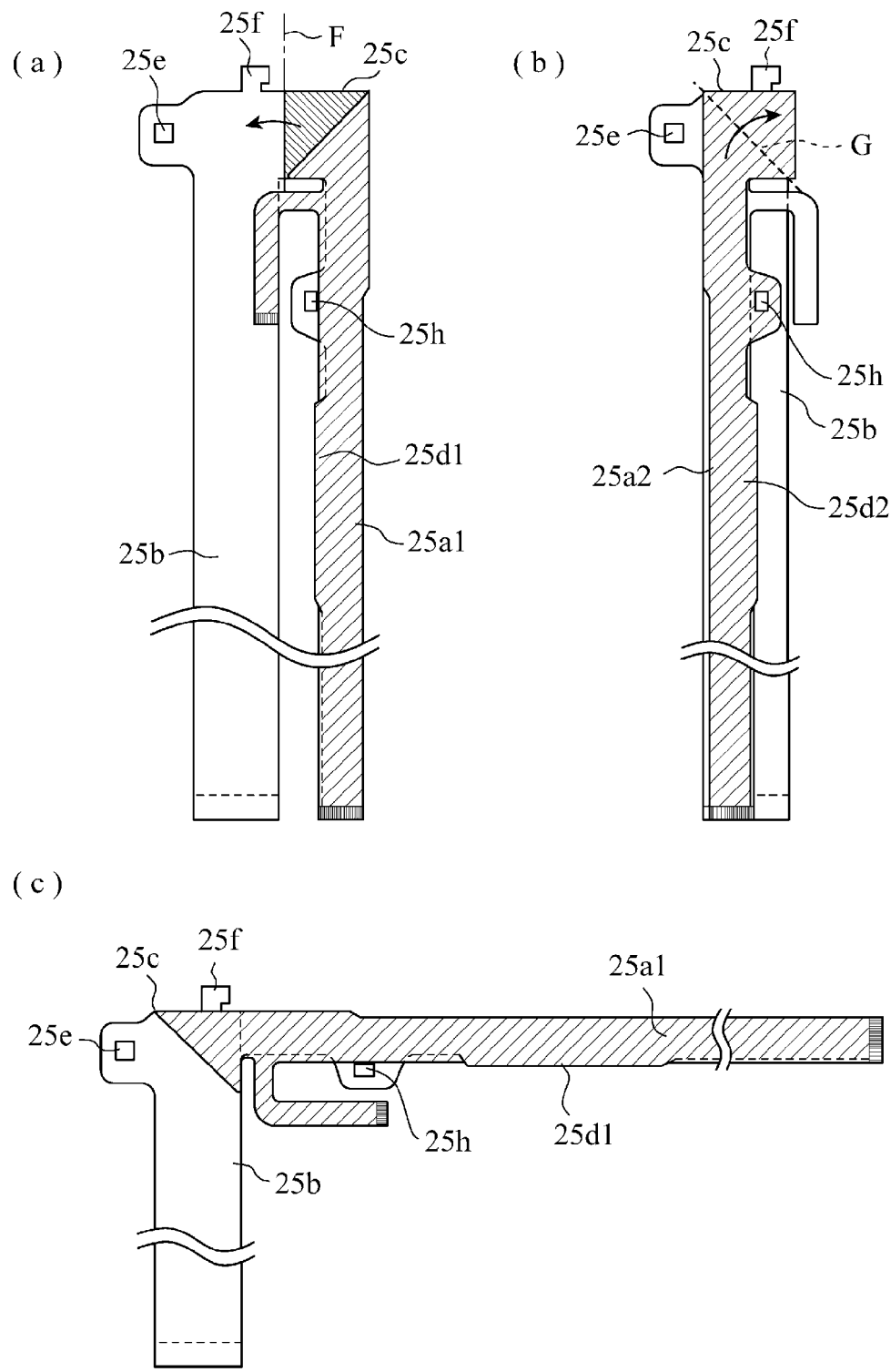
FIG. 7B is an explanatory view showing folding procedures (a)-(c) for forming the FPC having the shape shown FIG. 7A to one having the shape shown in FIG. 6.
Figure 7C:
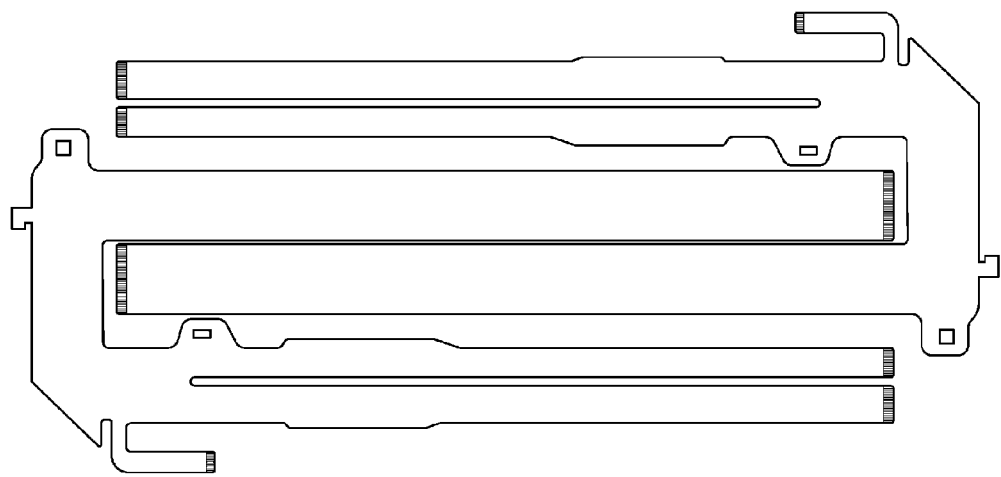
FIG. 7C is an explanatory view showing an example of disposing boards in producing the FPCs in accordance with the first embodiment of the present invention.
Figure 8:
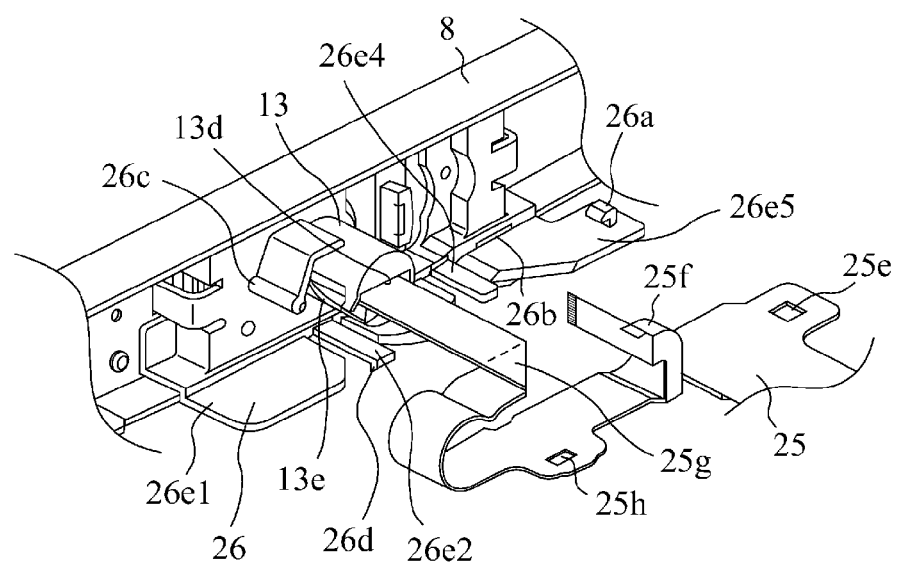
FIG. 8(a) and FIG. 8(b) are perspective views showing the FPC fixing structure in accordance with the first embodiment of the present invention as seen from the direction D shown in FIG. 2A.
Figure 8:
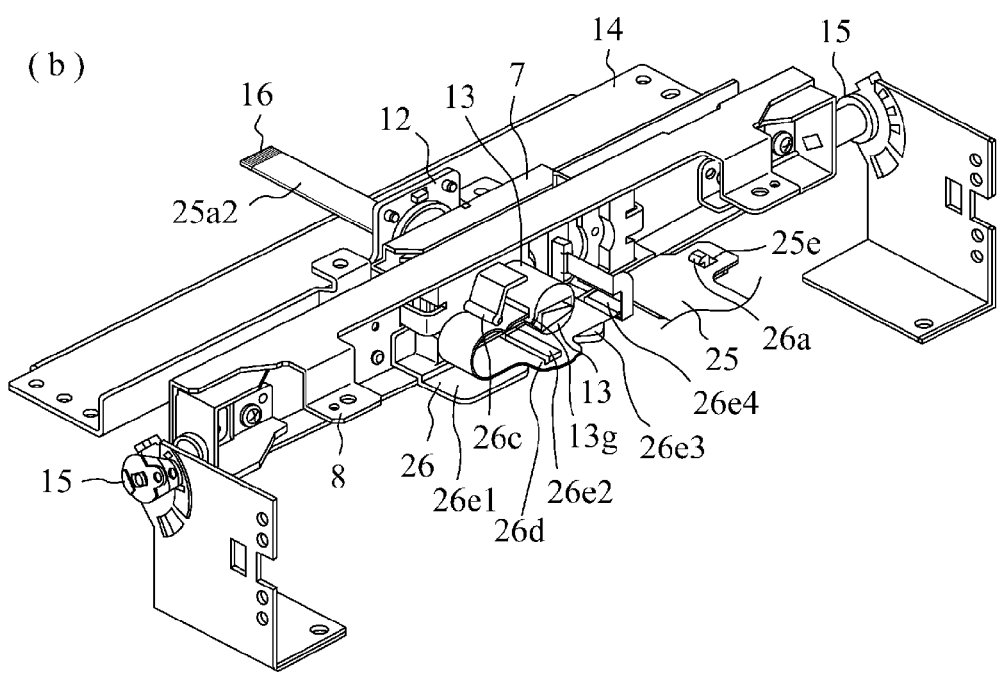

First, the FPC is folded along the fold line E shown in FIG. 7A to place the FPC in the state where the first straight line sections 25a1 and 25a2 are laminated with each other as shown in FIG. 7B (a). Then, a U-shaped base 25c of the FPC 25 is folded along the fold line F to bring the FPC to the state shown in FIG. 7B (b). Subsequently, the U-shaped base 25c is folded along the fold line G shown in FIG. 7B (b) to form the FPC 25 in the shape of the letter "L" as shown in FIG. 7B (c). Thus, when the L-shaped one is provided, the direction of the FPC 25 is changed by 90°, thus causing the FPC to meet the rotation directions of the first axis X and the second axis Y orthogonal to each other. Further, the U-shaped base 25c is folded in even times (the fold lines F and G), thus enabling the direction of the surface side and the reverse side of the FPC terminal section of the first straight line section latter half 25a2 after folding to be similar to the direction of the surface side and the reverse side of the FPC terminal section of the second straight line section 25b. Furthermore, the FPC 25 is formed in an U shape; thus, as shown in FIG. 7C, the space on a sheet can be used without waste to arrange the FPCs, thereby increasing the yield number of the FPCs.

When the FPC 25 formed in an L shape is wired and fastened in the boss 6 of the monitor turning mechanism 100, the first straight line sections 25a1, 25a2 are folded in the halfway portion as shown in FIG. 6 to form a folded section 25g. In this situation, as shown in FIG. 8(a), the FPC is inserted from the side of the FPC terminal section 16 through the insertion opening 13d of the second FPC fixing member 13. Note that the first straight line sections 25a1, 25a2 are folded along the fold line E and overlaid thereabove; thus, when the FPC is folded at the folded section 25g, the FPC terminal section 16 of the first straight line section first half 25a1 becomes identical with the FPC terminal section 16 of the second straight line section 25b in the direction of the surface side and the reverse side thereof.

In the fixing position of the FPC 25 to the second FPC fixing member 13, widened sections 25d1, 25d2 having a width L3 larger than the width L1 of the elongated hole 13b are provided. Furthermore, holes 25e, 25h, and a hook 25f used for fixing the FPC 25 to an FPC wiring fixing section 26 are formed around the L-shaped fold section, that is, around the U-shaped base 25c.

The hinge base 8 has the FPC wiring fixing section 26 fastened to the back thereof as shown in FIG. 8(a) and FIG. 8(b). A hole through which the second FPC fixing member 13 projecting from the back of the hinge base 8 is passed is provided through the FPC wiring fixing section 26. Further, presser plates 26e1-26e5 formed orthogonal to the hinge base 8 are laid side-by-side on the FPC wiring fixing section 26. Hooks 26a, 26d for engaging in holes 25e, 25h of the FPC 25 are formed on these presser plates 26e5, 26e2, respectively. A hole 26b for engaging a hook 25f of the FPC 25 is formed through the base section of the presser plate 26e5. Moreover, an FPC support member 26c for controlling the bending shape of the FPC 25 is provided on the FPC wiring fixing section 26.

When the FPC 25 is wired in the FPC fixing structure, the operation of folding the FPC 25 in predetermined positions (the fold lines F, G) is first performed to form the L-shaped one. Then, insertion of the FPC 25 from the side of the FPC terminal section 16 through the insertion opening 13d of the second FPC fixing member 13 is continued to pass the folded section 25g of the FPC 25 up to the opening 13e and pass the FPC under the protrusion 13g.

At this time, the folded section 25g of the FPC 25 has the edge thereof caused to adhere tightly to the inner face of the insertion opening 13d of the second FPC fixing member 13 by a buckle of the FPC returning to the original state because the FPC is only folded but not pasted; however, the FPC is guided by the tapered guide 13f provided on the folding side of the FPC, and thus the FPC 25 can be comfortably assembled to the second FPC fixing member 13. Further, in the state where the FPC 25 is completely inserted up to the folded section 25g thereof, the protrusion 13g suppresses and positions the widened section 25d1, 25d2 reached at the position of the opening 13e, and thus the FPC 25 is not dropped out from the second FPC fixing member 13. Moreover, the tip of the protrusion 13g is tapered, which facilitates the assembly of the FPC 25 and further enhancing the assembly workability thereof.

Moreover, the folded section 25g of the FPC 25 is arranged to be fastened within the second FPC fixing member 13; thus, the FPC 25 is in the state where the FPC is always pressed to the inner face of the elongated hole 13b by the reaction force of the folded section 25g, and further the FPC 25 is in the state where the widened section 25d thereof is held by the protrusion 13g, thus causing the FPC 25 to be held without backlash. Further, the first FPC fixing member 12 and the second FPC fixing member 13 fix the FPC 25 on the second axis Y in a linear manner, and simultaneously the first FPC fixing member 12 and the second FPC fixing member 13 are turned in synchronization with the monitor 3, thus preventing a twist from being inserted in the FPC 25 situated on the side of the monitor 3 from the second FPC fixing member 13. Since no twist occurs, the FPC 25 can be prevented from being damaged by the collisions between the FPC 25 and the first FPC fixing member 12, and between the FPC and the second FPC fixing member 13. Therefore, the reliability of the electric connection between a board (not shown) positioned on the side of the monitor and the FPC 25 can be secured.

Thereafter, in order to fasten the FPC 25 to the hinge base 8 of the two-axis hinge mechanism 10, the holes 25e, 25h, and the hook 25f of the FPC 25 are engaged with the hooks 26a, 26d, and the hole 26b of the FPC wiring fixing section 26 fixed on the hinge base 8. At this time, the FPC 25 is wired by hooking the FPC alternately over and under the presser plates 26e1-26e5. The holes 25e, 25h, and the hook 25f of the FPC 25 are located midway between the second straight line section 25b used for folding and unfolding flexure of the first axis X and the first straight line sections 25a1, 25a2 used for the turning flexure of the second axis Y, thus fixing the peripheral portions of those areas to the FPC wiring fixing portion 26. Therefore, when the monitor 3 is turned about the second axis Y, deformation by winding up is caused in the turning flexure portion (the deflection allowance) of the first straight line sections 25a1, 25a2; however, the influence does not reach the side of the board (not shown) of the monitor housing case 2 from the folding and unfolding flexure portion of the second straight line section 25b. Further, even if deformation by winding up is caused in the turning flexure portion of the second axis Y, the deformation is hampered by the presser plate 26e1, thus preventing the turning flexure portion from being deformed outwardly from the presser plate 26e1. Furthermore, when the monitor 3 is rotated about the first axis X, deformation is caused in the folding and unfolding flexure potion of the second straight line section 25b pulled out from the FPC wiring fixing section 26 to the side of the monitor housing case 2; however, the influence does not reach the first straight line sections 25a1, 25a2.

As shown in FIG. 8(b), the portion of the FPC 25 located between the folded section 25g and the U-shaped base 25c is used for the deflection allowance required for the turn about the second axis Y, and also the portion of FPC having the deflection allowance is wired outside the second axis Y so as to be in the direction orthogonal to the second axis Y. In this context, since the FPC 25 is wired centered on the second axis Y, the amount of deflection allowance of the FPC 25 required for the turn may be small. Further, the deflection allowance is provided outside the second axis Y, and thus the space for forming the portion having the deflection allowance in the shape of a large arc can be secured.

Figure 9A:
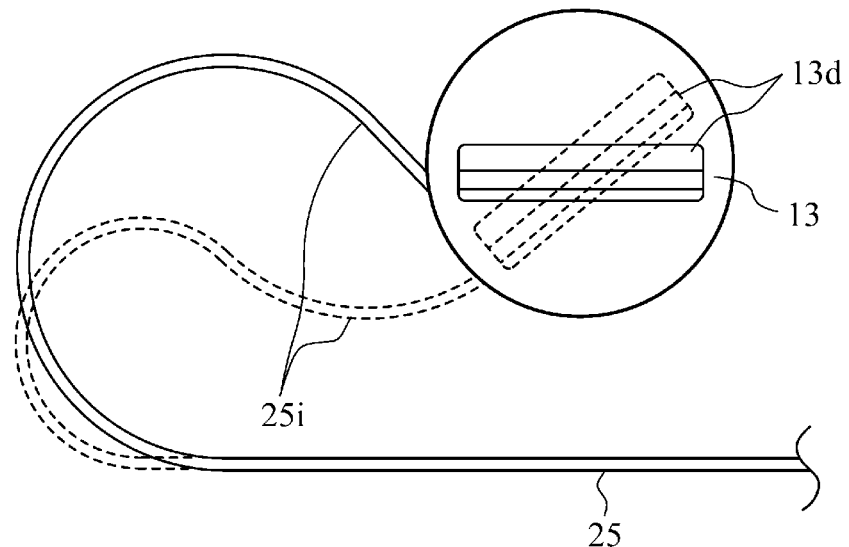
FIG. 9A is an explanatory view showing the shape of a curved portion of an FPC when an FPC wiring fixing section has no FPC support member.
Figure 9B:
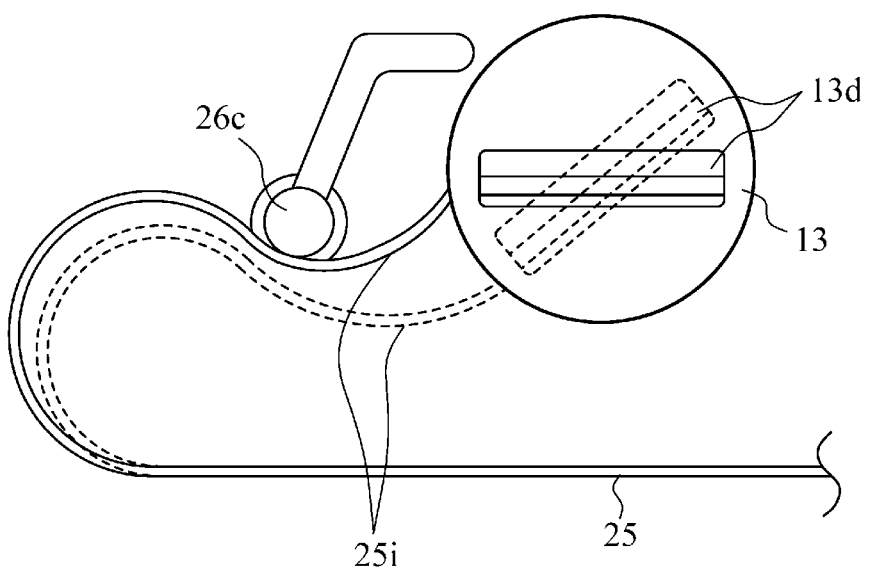
FIG. 9B is an explanatory view showing the shape of the curved portion of the FPC when an FPC support member of the FPC wiring fixing section in accordance with the first embodiment of the present invention is provided.

The portion of FPC having the deflection allowance is engaged by the FPC support member 26c of the FPC wiring fixing portion 26, abutting thereagainst, and has the curved shape thereof controlled by the support member. FIG. 9A is an explanatory view showing a curved portion 25i having the deflection allowance when there is not provided the FPC support member 26*c*. FIG. 9B is an explanatory view showing the shape of the curved portion 25*i* when there is provided the FPC support member 26*c* of the FPC wiring fixing section 26 in accordance with the first embodiment. In FIG. 9A and FIG. 9B, the second FPC fixing member 13 and the FPC 25 both existing in the state where the monitor 3 faces the front are represented in full lines, and the second FPC fixing member 13 and the FPC 25 turned in synchronization with the turn of the monitor 3 are indicated by dotted lines. When there is not provided the FPC support member 26*c* in the FPC wiring fixing section 26, the curved portion 25*i*, as shown in FIG. 9A, sometimes rapidly changes by the turn of the second FPC fixing member 13 to reverse the curve thereof. When such reversion occurs, abnormal noise is caused, and the FPC 25 has excessive stresses imposed thereon, thus occasionally shortening the life of the FPC 25. Otherwise, when there is provided the FPC support member 26*c* in the FPC wiring fixing section 26, the FPC support member 26*c* maintains the curved portion 25*i* in the curved shape as shown in FIG. 9B, and thus the reversion of the curve is not caused. Therefore, the abnormal noise is prevented from being generated, and the FPC 25 has no excessive stresses imposed thereon.

The portion of the FPC 25 extending from the FPC wiring fixing section 26 to the monitor housing case 2 (that is, the second straight line section 25*b*) is turned 90° in the wiring direction by fold shaping, and is fastened to the board (not shown) of the monitor housing case 2, having a curve required for folding and unfolding the monitor 3. Therefore, the direction where the FPC is flexed can be arranged to be aligned with the longitudinal direction of the pattern line of the FPC 25 in both the turning flexure portion and the folding and unfolding flexure portion, and the FPC can have the flexure life balanced in the first straight line sections 25*a*1, 25*a*2, and the second straight line section 25*b*.

As discussed above, in accordance with the first embodiment, the FPC fixing structure for the two-axis hinge mechanism 10 is arranged such that the monitor turning mechanism 100 includes the tubular boss 6 of which one end is fixed to the monitor mounting base 14, and the other end is turnably supported by the hinge base 8 of the monitor folding and unfolding mechanism 110 about the second axis Y; the second FPC fixing member 13 that is fastened within the boss 6, protrudes from the hinge base 8 of the monitor folding and unfolding mechanism 110, also has the insertion opening 13*d* in the end face on the hinge base 8 side, and passes the FPC 25 through the insertion opening 13*d* to the side of the monitor 3 to hold the FPC linearly on the second axis Y; and the FPC wiring fixing section 26 that curves, outside the second axis Y, the FPC 25, which is pulled out in the direction orthogonal to the second axis Y from the one end side of the second FPC fixing member 13 where the insertion opening 13*d* is provided, to cause the FPC to have a deflection allowance, and that fixes the FPC to the hinge base 8. According to the arrangement, the flexure of the FPC 25 caused by the turn of the monitor 3 is provided outside the second axis Y, and thus, the FPC 25 can be prevented from being damaged in the turning, and the folding and unfolding movements of the monitor 3. Furthermore, the FPC 25 is wired centered on the second axis Y, and thus the amount of flexure of the FPC 25 required by the turn can be reduced. Further, since the large circular arc of the FPC can be secured by providing the deflection allowance outside the second axis Y, the stresses caused by the flexure of the FPC 25 can be reduced.

Moreover, in accordance with the first embodiment, the FPC fixing structure for the two-axis hinge mechanism is arranged to include the protrusion-shaped switch abutting section 13*h* formed around the outer peripheral face on the hinge base 8 side of the second FPC fixing member 13; and the turn position detecting means, which is secured to the hinge base 8 and used for detecting the turn angle of the monitor 3 by abutting against the switch abutting section 13*h*. Therefore, the detection of the turn angle of the monitor 3 becomes possible without using a complicated mechanism.

Furthermore, in accordance with the first embodiment, the FPC 25 is arranged to have the widened sections 25*d*1, 25*d*2 larger than the width of the insertion opening 13*d* of the FPC fixing member in the position thereof where the FPC is inserted in the second FPC fixing member 13. That positions the FPC 25 within the second FPC fixing member 13. Thus, even when the FPC 25 has a load imposed thereon by the turning, and the folding and unfolding movements of the monitor 3 and when the monitor apparatus 1 using the two-axis hinge mechanism 10 has vibration transferred thereto, the tendency of the FPC 25 to be disconnected from the second FPC fixing member 13 is reduced, the FPC 25 can be prevented from being damaged by the collision between the FPC and the FPC fixing structure, and abnormal noise can be prevented from being generated by the collision.

Additionally, in accordance with the first embodiment, it is arranged that the second FPC fixing member 13 have the opening 13*e* communicating with the insertion opening 13*d* in the outer peripheral face thereof on the hinge base 8 side, and the opening 13*e* pull out the FPC 25 folded in the direction orthogonal to the second axis Y within the second FPC fixing member 13. According to the arrangement, the FPC 25 exists in the state where the FPC is always pressed by the reaction force of the folded section 25*g* of the FPC 25 within the second FPC fixing member 13. Thus, even when the FPC 25 has a load imposed thereon by the turning and the folding and unfolding movements of the monitor 3 and when the monitor apparatus 1 using the two-axis hinge mechanism 10 has vibration transferred thereto, the tendency of the FPC 25 to be disconnected from the second FPC fixing member 13 is reduced, the FPC 25 can be prevented from being damaged by the collision between the FPC and the FPC fixing structure, and abnormal noise can be prevented from being generated by the collision.

Besides, in accordance with the first embodiment, the insertion opening 13*d* of the second FPC fixing member 13 is arranged to have provide thereon the guide 13*f* having a tapered opening shape. Therefore, even if there is a buckle of the folded section 25*g* of the FPC 25 when the FPC 25 is inserted in the second FPC fixing member 13, since the FPC is guided by a diagonal taper of the guide 13*f*, the assembling work of the FPC 25 can be comfortably performed.

In addition, in accordance with the first embodiment, it is arranged that the protrusion 13*g* for restraining the FPC 25 from moving from the opening 13*e* to the insertion opening 13*d* is provided between the opening 13*e* and the insertion opening 13*d* of the second FPC fixing members 13. For this reason, even if a force is acted on the FPC 25 in the turning direction about the second axis Y, the FPC 25 is not disconnected and dropped from the second FPC fixing member 13. Moreover, the protrusion 13*g* having a tapered shape can further increase the assembly workability of the FPC 25.

Further, in accordance with the first embodiment, the FPC wiring fixing section 26 is arranged to have provided thereon the FPC support member 26*c* for abutting against the portion having the deflection allowance of the FPC 25 pulled out from the second FPC fixing member 13 to maintain the curved shape of the FPC. Therefore, it becomes possible to always maintain the curved shape of the FPC 25 in the same condition, and the problem of abnormal noise generated from the FPC 25 because of the rapid change of the FPC 25 in the bending condition by the turn of the monitor 3 can be overcome.

Moreover, in accordance with the first embodiment, it is arranged that the FPC 25 be formed in U shape, the first straight line sections 25a1, 25a2 of one side of the U shape of the FPC be used for the deflection allowance to employ the section as the turning flexure portion of the monitor turning mechanism 100, and the second straight line section 25b of the other side be pulled out from the FPC wiring fixing section 26 to the monitor housing case 2 to use the section as the folding and unfolding flexure portion of the monitor folding and unfolding mechanism 110. Thus, forming the FPC 25 in U shape can increase the number of FPCs produced per unit area of material. Further, using the respective straight line sections in the turning flexure portion and the folding and unfolding flexure portion can balance the flexure life in those straight line sections.

Besides, in accordance with the first embodiment, it is arranged that the U-shaped FPC 25 has pattern lines using rolled copper, and is shaped into an L-shaped one by folding the FPC such that the rolling direction of the pattern line is aligned with the direction where the FPC is flexed in the turning flexure portion and also in the folding and unfolding flexure portion. Therefore, the flexing of the pattern line of the FPC 25 can take one direction with respect to the rolling direction of the pattern line of the FPC 25, and thus inequality in the flexure life between the turning flexure portion and the folding and unfolding flexure portion can be eliminated.

Hereupon, in the aforementioned first embodiment, in order to fix the second FPC fixing member 13 within the boss 6 to be synchronized with the turn of the monitor 3, the first FPC fixing member 12 is employed; however, when the second FPC fixing member 13 is arranged to be fastened inside the boss 6 to be united, the first FPC fixing member 12 is unnecessary. Furthermore, it is arranged that the boss 6 is turnably attached to the sub-base 7, the sub-base 7 is secured to the hinge base 8, and thereby the boss 6 is turnably supported by the monitor folding and unfolding mechanism 110 about the second axis Y; however, it may be arranged that the boss 6 is turnably attached directly to the hinge base 8.

INDUSTRIAL APPLICABILITY

The FPC fixing structure for the two-axis hinge mechanism according to the present invention can prevent the FPC from being damaged by the turning, and the folding and unfolding movements of the monitor, and can reduce the amount of flexure of the FPC, by holding the FPC linearly on the monitor turning axis and also providing the deflection allowance outside the monitor turning axis. Further, the FPC fixing structure for the two-axis hinge mechanism can hold the FPC in a shape of a large circular arc to enable the reduction of the stresses caused by the flexure of the FPC 25, by providing the deflection allowance outside the monitor turning axis. Thus, the FPC fixing structure for the two-axis hinge mechanism is suitable for use in a fixing structure or the equivalent for wiring an FPC in a two-axis hinge mechanism for turning, and folding and unfolding a monitor.

The invention claimed is:

1. An FPC fixing structure for a two-axis hinge mechanism for fixing an FPC for an electrical connection between a main body apparatus and a monitor to a two-axis hinge mechanism that is composed of:
   a monitor folding and unfolding mechanism for allowing the monitor to be folded and unfolded about a first axis with respect to the main body apparatus; and a monitor turning mechanism for allowing the monitor having been turned in the unfolded direction with respect to the first axis to be turned about a second axis that is orthogonal to the first axis, wherein the monitor turning mechanism comprises:
   a tubular boss of which one end is fixed to the side of the monitor and the other end is turnably supported by a base of the monitor folding and unfolding mechanism about the second axis;
   an FPC fixing member that is fastened within the boss, protrudes from the base of the monitor folding and unfolding mechanism, also has an insertion opening through the end face thereof on the base side, and passes the FPC through the insertion opening to the side of the monitor to hold the FPC linearly on the second axis; and
   an FPC wiring fixing section that curves outside the second axis the FPC that is led from the one end side of the FPC fixing member where the insertion opening is provided in the direction orthogonal to the second axis, to cause the FPC to have a deflection allowance, and that fixes the FPC to the base.

2. The FPC fixing structure for a two-axis hinge mechanism according to claim 1, further comprising:
   an abutting section having a protrusion shape that is formed around the outer peripheral face on the base side of the FPC fixing member; and
   a turn position detecting means that is secured to the base and detects the turn angle of the monitor by abutting against the abutting section turned integrally with the monitor.

3. The FPC fixing structure for a two-axis hinge mechanism according to claim 1, wherein the FPC has a widened section larger than the width of the insertion opening of the FPC fixing member in the position thereof where the FPC is inserted in the FPC fixing member.

4. The FPC fixing structure for a two-axis hinge mechanism according to claim 1, wherein the FPC fixing member has an opening communicating with the insertion opening in the outer peripheral face thereof on the base side, and the opening is to lead out the FPC that is folded in the direction orthogonal to the second axis within the FPC fixing member.

5. The FPC fixing structure for a two-axis hinge mechanism according to claim 4, wherein a protrusion for restraining the FPC from moving from the opening to the insertion opening is provided between the opening and the insertion opening of the FPC fixing member.

6. The FPC fixing structure for a two-axis hinge mechanism according to claim 5, wherein the protrusion provided between the opening and the insertion opening of the FPC fixing member has a tapered shape.

7. The FPC fixing structure for a two-axis hinge mechanism according to claim 1, wherein the insertion opening of the FPC fixing member has a tapered opening shape.

8. The FPC fixing structure for a two-axis hinge mechanism according to claim 7, wherein a protrusion for restraining the FPC from moving from the opening to the insertion opening is provided between the opening and the insertion opening of the FPC fixing member.

9. The FPC fixing structure for a two-axis hinge mechanism according to claim 8, wherein the protrusion provided between the opening and the insertion opening of the FPC fixing member has a tapered shape.

10. The FPC fixing structure for a two-axis hinge mechanism according to claim 1, wherein the FPC wiring fixing section is provided with an FPC support member for abutting against a portion possessed of deflection allowance of the FPC led out from the FPC fixing member to hold the curved shape thereof.

11. The FPC fixing structure for a two-axis hinge mechanism according to claim 1, wherein
   the FPC is provided in an U shape;
   the straight line section of one side of the U shape of the FPC is used as a portion possessed of deflection allowance to cause the section to work as a turning flexure portion of the monitor turning mechanism; and
   the straight line section of the other side is led out from the FPC wiring fixing section to the side of the main body apparatus to cause the section to function as a folding and unfolding flexure portion of the monitor folding and unfolding mechanism.

12. The FPC fixing structure for a two-axis hinge mechanism according to claim 11, wherein the FPC has a pattern line with rolled copper, and
   the FPC is formed from the U-shape in an L-shape by folding, such that the rolling direction of the pattern line is aligned with the direction where the FPC is flexed in the turning flexure portion and also in the folding and unfolding flexure portion.

* * * * *